(12) United States Patent
Richardson et al.

(10) Patent No.: US 8,796,693 B2
(45) Date of Patent: Aug. 5, 2014

(54) SUCCESSIVE IONIC LAYER ADSORPTION AND REACTION PROCESS FOR DEPOSITING EPITAXIAL ZNO ON III-NITRIDE-BASED LIGHT EMITTING DIODE AND LIGHT EMITTING DIODE INCLUDING EPITAXIAL ZNO

(71) Applicant: Seoul Semiconductor Co., Ltd., Ansan-si (KR)

(72) Inventors: Jacob J. Richardson, Goleta, CA (US); Daniel Estrada, Goleta, CA (US); Evan C. O'Hara, Goleta, CA (US); Haoran Shi, Goleta, CA (US); Shin Chanseob, Ansan-si (KR); Yeojin Yoon, Ansan-si (KR)

(73) Assignee: Seoul Semiconductor Co., Ltd., Ansan-si (KR)

( * ) Notice: Subject to any disclaimer, the term of this patent is extended or adjusted under 35 U.S.C. 154(b) by 47 days.

(21) Appl. No.: 13/727,083

(22) Filed: Dec. 26, 2012

(65) Prior Publication Data
US 2014/0175452 A1 Jun. 26, 2014

(51) Int. Cl.
*H01L 33/22* (2010.01)
(52) U.S. Cl.
USPC .................................................. 257/76
(58) Field of Classification Search
USPC ............................................ 257/76; 438/29
See application file for complete search history.

(56) References Cited

U.S. PATENT DOCUMENTS

| 2010/0263586 A1 | 10/2010 | Richardson et al. | |
|---|---|---|---|
| 2010/0313953 A1* | 12/2010 | Zook et al. | 136/259 |
| 2011/0101414 A1 | 5/2011 | Thompson et al. | |
| 2011/0108873 A1 | 5/2011 | Richardson et al. | |
| 2011/0266551 A1 | 11/2011 | Thompson et al. | |
| 2013/0098440 A1* | 4/2013 | Hodes et al. | 136/256 |
| 2014/0022779 A1* | 1/2014 | Su et al. | 362/231 |

OTHER PUBLICATIONS

J. H. Kim, et al., "Growth of Heteroepitaxial ZnO Thin Films on GaN-Buffered Al2O3 (0001) Substrates by Low-Temperature Hydrothermal Synthesis at 90° C.", Advanced Functional Materials, 2007, p. 463-471, vol. 17, WILEY-VCH Verlag GmbH & Co. KGaA, Weinheim.

Y. F. Nicolau, "Solution deposition of thin solid compound films by a successive ionic-layer adsorption and reaction process", Applications of Surface Science, 1985, p. 1061-1074, 22/23, Part 2 (0), Elsevier Science Publishers B.V., North-Holland, Amsterdam.

T. P. Niesen, et al., "Review: Deposition of Ceramic Thin Films at Low Temperatures from Aqueous Solutions", Journal of Electroceramics, 2001, p. 169-207, 6 (3), Kluwer Academic Publishers, Netherlands.

* cited by examiner

*Primary Examiner* — Thao P Le
(74) *Attorney, Agent, or Firm* — H.C. Park & Associates, PLC

(57) ABSTRACT

A method of forming a ZnO layer on a substrate and an LED including a ZnO layer formed by the method are provided. The ZnO layer is formed by using a Successive Ionic Layer Adsorption and Reaction (SILAR) process. The SILAR process includes: applying a first solution to a substrate comprising GaN, to form an inner ionic layer on the substrate and an outer ionic layer on the inner ionic layer; performing a first washing operation on the substrate to remove the outer ionic layer; and applying a second solution to the washed substrate to convert the inner ionic layer into a ZnO oxide layer.

27 Claims, 15 Drawing Sheets

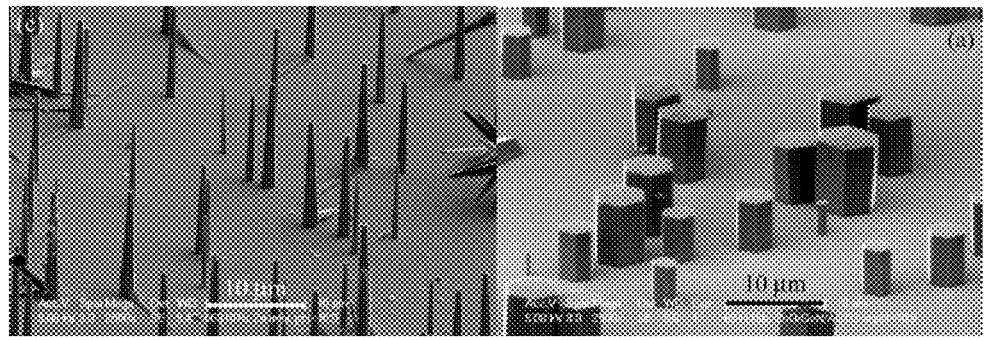
FIG. 1A
(Related Art)
FIG. 1B
(Related Art)
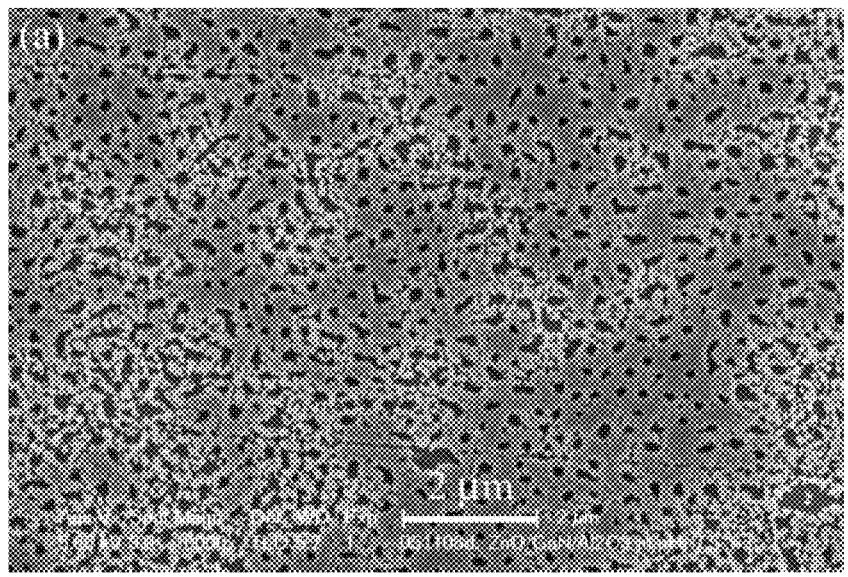
FIG. 2
(Related Art)

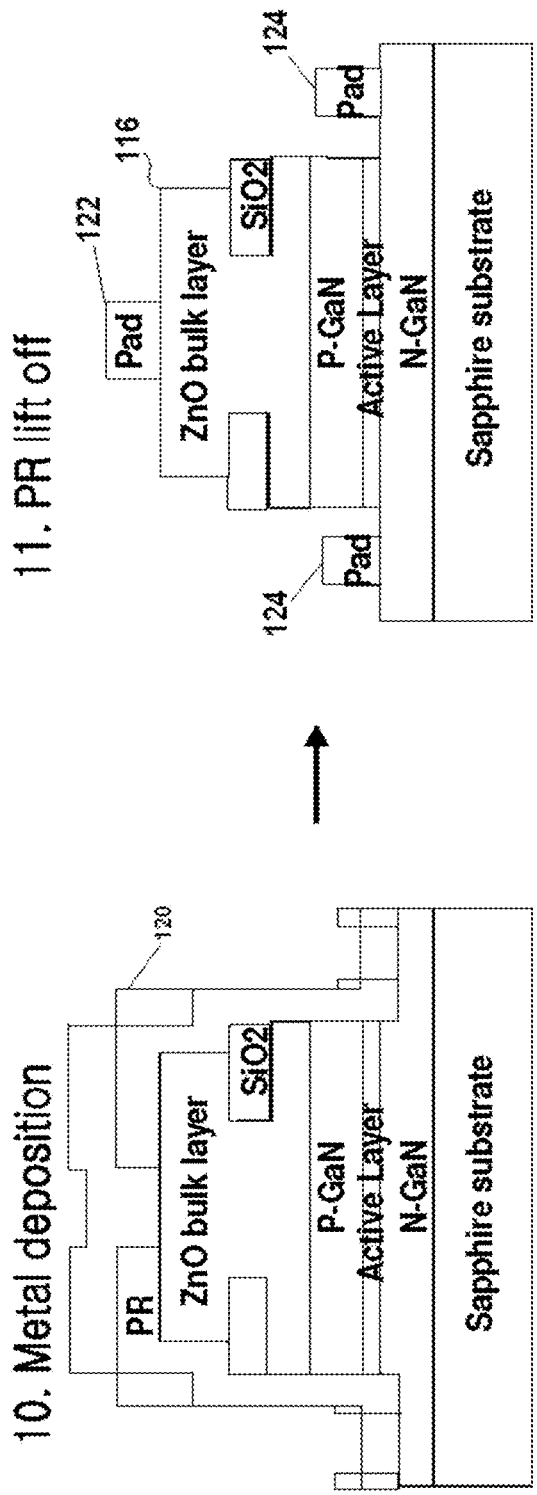

SUCCESSIVE IONIC LAYER ADSORPTION AND REACTION PROCESS FOR DEPOSITING EPITAXIAL ZNO ON III-NITRIDE-BASED LIGHT EMITTING DIODE AND LIGHT EMITTING DIODE INCLUDING EPITAXIAL ZNO

BACKGROUND

1. Field

Aspects of the present invention relate to a Successive Ionic Layer Adsorption and Reaction (SILAR) process for depositing epitaxial ZnO on III-nitride based light emitting diode (LED), and an LED including the epitaxial ZnO layer.

2. Discussion of the Background

III-Nitride based LEDs are often fabricated using Mesa geometry. In the Mesa geometry, both the positive and negative electrical contacts to the LED are made on the top side of a semiconductor wafer including a p-type III-Nitride layer, an active layer, and an n-type III-Nitride layer disposed on a substrate. The sheet resistance of the p-type III-Nitride layer is generally much larger than the n-type III-Nitride layer. This causes a phenomenon known as p-contact current crowding. P-contact current crowding occurs because the path of least resistance for current flow results in higher electrical injection into the active layer of the LED in the vicinity of the external electrical contact to the p-type III-Nitride layer.

The resulting higher local current density and light generation near the p-contact leads to lower overall device efficiency. A typical solution to this issue has been the use of a current spreading layer to provide more uniform distribution of current injected by lowering the sheet resistance on the p-side of the device. Because the light generated must pass through the current spreading layer to escape the device, the current spreading layer typically includes layer(s) of a very thin semi-transparent metal or a transparent conductive oxide (TCO). Indium Tin Oxide (ITO) has become the industry standard material for current spreading layers in III-Nitride LEDs, due to having a good combination of transparency and electrical conductivity. However, ITO has high raw material costs, which make it generally undesirable. In addition, the highest quality ITO films are typically deposited using magnetron sputtering, which requires special precautions in order to prevent plasma damage to III-Nitride LEDs during deposition.

Zinc oxide based TCO films are used as an alternative to ITO in some applications. Zinc oxide may be deposited on III-Nitride LEDs by the same methods typically used for ITO films, including sputtering, but can also be deposited using low temperature aqueous solution deposition. Unlike ITO, ZnO also has a good crystal lattice match with GaN and other Wurtzite structured III-Nitride semiconductors with similar lattice parameters. The good lattice match allows for epitaxial ZnO layers to be formed on III-Nitride LED surfaces, even when the ZnO is formed by low temperature aqueous solution deposition. As compared to polycrystalline layers, epitaxial layers can possess higher optical transparency and electrical carrier mobility, which lead to enhanced current spreading layer performance. As compared to sputter deposition of ITO, the low temperature aqueous solution deposition of ZnO offers advantages in materials, capital equipment, and energy costs. This makes low temperature solution deposition of ZnO based TCO layers attractive for high-performance, low-cost, III-Nitride LED current spreading layers.

Aqueous solution methods have been used previously to synthesize a wide variety of ZnO films and Micro/Nano-Structures. In most cases, the deposition of a uniform film or array of nano/microstructures requires the use of a nucleation or seed layer. The purpose of the nucleation/seed layer is to provide a uniform distribution of sites for the growth of ZnO during the low temperature solution growth. FIGS. 1A and 1B show scanning electron microscope images of ZnO deposited on a c-plane GaN surfaces by low temperature aqueous solution deposition without the use of a nucleation/seed layer. As shown in FIGS. 1A and 1B, without a seed layer, conditions used for solution deposition/growth typically lead to non-uniform and/or low density of nucleation sites, which develop into a low density of spatially separated large structures or islands, rather than the desired uniform array or film.

Several different methods have previously been explored for nucleation/seed layer creation, including coating with a suspension of ZnO nanoparticles, coating with a precursor film which upon heating decomposes and crystallizes into ZnO, vapor deposition of a thin ZnO layer, and aqueous deposition by initiating the rapid precipitation of ZnO from solution. These techniques all have serious drawbacks for producing epitaxial films using low temperature aqueous solution deposition.

The use of nanoparticle seeds deposited from suspension is not compatible with epitaxial growth, as it creates a seed layer composed of particles with random orientations. The same is true for the precursor film method, unless very high temperatures are used to epitaxially recrystallize the initially polycrystalline ZnO seed layer. Vapor deposition is capable of producing epitaxial seed layers, but the use of such methods to produce the seed layer negates much of the cost advantage of using low temperature aqueous solution deposition for subsequent bulk film growth. Processes for creating the seed layer by precipitation from aqueous solution have been shown to create epitaxial ZnO, but the processes fail to provide high nucleation density and uniformity.

FIG. 2 shows a scanning electron microscope image of a seed layer produced by the precipitation method. The ZnO produced is visibly not uniform and leaves a significant portion of the GaN surface uncovered. In addition, the ZnO particles that simultaneously form during precipitation can settle on the seed layer surface in a random orientation and disrupt subsequent epitaxial growth. The majority of the zinc dissolved in the solution is consumed in the formation of powder particles rather than the seed layer, making the precipitation method of seed layer deposition very inefficient in precursor chemical use.

A Successive Ionic Layer Adsorption and Reaction (SILAR) method may be considered to be the aqueous solution phase analog to Atomic Layer Deposition (ALD). The SILAR process is performed by repeatedly cycling two self-limiting reactions, with each one adding the cationic or anionic atoms, respectively, to slowly build a binary compound film. ALD uses precursor molecules adsorbed from the gas phase. SILAR uses adsorption of ions dissolved in aqueous solution.

In a SILAR of oxides, water itself can be the source of the oxygen though hydrolysis and condensation reactions with the cationic species. Hydrolysis can be promoted though control of the pH, or simply using hot water. ZnO films can be deposited using a solution of zinc ammine complex ions to supply the Zn and hot water to perform the hydrolysis.

However, the conventional art has failed to provide a method of using SILAR to form a ZnO film formed on an LED. As such, the present invention is directed to providing a method of producing a ZnO film on an LED, using SILAR. Further, the present invention is also directed to providing LEDs that include such a ZnO film, which have improved characteristics over LEDs including conventionally produced ZnO layers.

SUMMARY OF THE INVENTION

According to various embodiments of the present invention, provided is a method of forming an LED including a ZnO layer that is formed using a SILAR method, and LEDs including the same.

Additional features of the invention will be set forth in the description which follows, and in part will be apparent from the description, or may be learned by practice of the invention.

An exemplary embodiment of the present invention provides a method of forming an epitaxial ZnO layer using a Successive Ionic Layer Adsorption and Reaction (SILAR) process, the method including: performing the SILAR process on a substrate comprising GaN, repeating the SILAR process; and performing a first anneal on the substrate to form the epitaxial ZnO layer. The SILAR process includes: applying a first solution to the substrate to form an inner ionic layer disposed on the substrate and comprising Zn ions or complexes, and outer ionic layer disposed on the inner ionic layer; performing a first washing operation on the substrate to remove the outer ionic layer and any excess amount of the first solution; and applying a second solution to the washed substrate to convert the inner ionic layer into an oxide layer.

An exemplary embodiment of the present invention provides a method of forming a III-Nitride based LED, the method comprising: forming a first GaN layer on a substrate, an active layer on the first GaN layer, and a second GaN layer on the active layer, the first and second GaN layers having different ones of a P-type dopant and an N-type dopant; mesa etching the substrate to expose the first GaN layer; forming a passivation layer on the mesa-etched substrate; forming a first photoresist layer on the passivation layer; etching the substrate using the first photoresist layer as a mask, to expose the second GaN layer; forming a ZnO layer on the exposed second GaN layer using a Successive Ionic Layer Adsorption and Reaction (SILAR) process; increasing the thickness of the ZnO layer using an aqueous deposition process; and annealing the substrate.

An exemplary embodiment of the present invention provides a method of forming a III-Nitride based LED, the method comprising: forming a first GaN layer on a substrate, an active layer on the first GaN layer, and a second GaN layer on the active layer, the first and second GaN layers having different ones of a P-type dopant and an N-type dopant; forming a ZnO layer on the second GaN layer using a Successive Ionic Layer Adsorption and Reaction (SILAR) process; forming a first photoresist layer on the ZnO layer, etching the ZnO layer using the first photoresist layer as a mask; mesa etching the substrate to expose the first GaN layer; and forming electrode pads on the ZnO layer and the first GaN layer.

An exemplary embodiment of the present invention provides a method of forming a III-Nitride based LED, the method comprising: forming a first GaN layer on a substrate, an active layer on the first GaN layer, and a second GaN layer on the active layer, the first and second GaN layers having different ones of a P-type dopant and an N-type dopant; forming a ZnO layer on the second GaN layer using a Successive Ionic Layer Adsorption and Reaction (SILAR) process; forming a passivation layer on the substrate and that exposes a portion of the ZnO layer; increasing the thickness of the exposed portion of the ZnO layer using a low-temperature aqueous ZnO deposition method; forming a first photoresist layer on the substrate and that exposes a portion of the passivation layer; etching the substrate using the first photoresist layer as a mask, to remove the exposed portion of the passivation layer; mesa etching the substrate to expose a portion of the first GaN layer; and forming electrode pads on the ZnO layer and the first GaN layer.

An exemplary embodiment of the present invention provides a method of forming a III-Nitride based LED, the method comprising: forming a first GaN layer on a substrate, an active layer on the first GaN layer, and a second GaN layer on the active layer, the first and second GaN layers having different ones of a P-type dopant and an N-type dopant; forming a ZnO layer on the second GaN layer using a Successive Ionic Layer Adsorption and Reaction (SILAR) process; forming a first photoresist layer on the ZnO layer and that exposes a portion of the ZnO layer; increasing the thickness of the exposed portion of the ZnO layer using a low-temperature aqueous ZnO deposition method; forming a second photoresist layer on the substrate and that covers the thicker portion of the ZnO layer; etching the substrate using the second photoresist layer as a mask, to expose a portion of the first GaN layer; and forming electrode pads on the ZnO layer and the first GaN layer.

An exemplary embodiment of the present invention provides a method of forming a III-Nitride based LED, the method comprising: forming a first GaN layer on a substrate, an active layer on the first GaN layer, and a second GaN layer on the active layer, the first and second GaN layers having different ones of a P-type dopant and an N-type dopant; forming a first photoresist layer on the second GaN layer; mesa etching the substrate, using the first photoresist layer as a mask, to expose the first GaN layer; forming a second photoresist layer on the substrate and that exposes the second GaN layer; forming a ZnO layer on the second GaN layer using a Successive Ionic Layer Adsorption and Reaction (SILAR) process that uses second photoresist layer as a mask; forming an electrode pad on the first GaN layer; forming a third photoresist layer on the substrate and that exposes the ZnO layer; increasing the thickness of the ZnO layer using a low-temperature aqueous ZnO deposition method; and forming an electrode pad on the ZnO layer.

An exemplary embodiment of the present invention provides a method of forming a III-Nitride based LED, the method comprising: forming a first GaN layer on a substrate, an active layer on the first GaN layer, and a second GaN layer on the active layer, the first and second GaN layers having different ones of a P-type dopant and an N-type dopant; forming a passivation layer on the substrate and that exposes a portion of the second GaN layer; forming a ZnO layer on the exposed portion of the second GaN layer using a Successive Ionic Layer Adsorption and Reaction (SILAR) process; etching the passivation layer to expose a portion of the second GaN layer; mesa etching the substrate to expose portions of the first photoresist layer; forming a first photoresist layer on the substrate and that exposes portions of the first GaN layer and the ZnO layer; and forming electrodes on the exposed portions of the first GaN layer and the ZnO layer.

An exemplary embodiment of the present invention provides a III-Nitride LED comprising: a substrate; a first GaN layer disposed on the substrate; an active layer disposed on the first GaN layer; a second GaN layer disposed on the active layer; and a ZnO composite layer disposed on the second GaN layer, the composite layer comprising: a first ZnO layer disposed on the second GaN layer and having a first conductivity; and a second ZnO layer disposed on the first ZnO layer and have a second conductivity that is higher than the first conductivity.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

FIGS. 1A and 1B illustrate ZnO deposited on a substrate using a related art deposition method.

FIG. 2 illustrates a ZnO seed layer formed on a substrate using a related art deposition method.

FIGS. 11A and 11B illustrate a method of forming an LED including a ZnO layer, according to an exemplary embodiment of the present invention.

DETAILED DESCRIPTION OF THE ILLUSTRATED EMBODIMENTS

Figure 3:
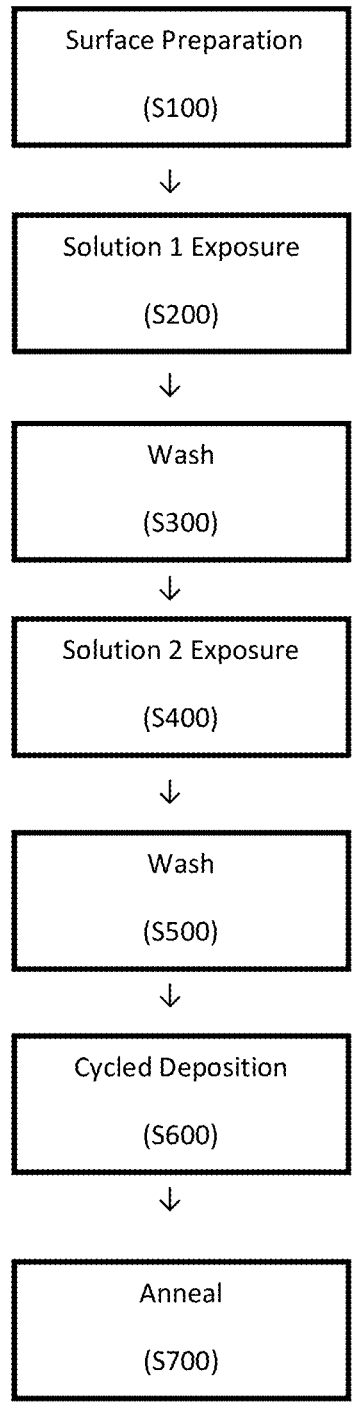
FIG. 3 is a block diagram illustrating a method of forming a ZnO layer on a semiconductor wafer, according to an exemplary embodiment of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure is thorough, and will fully convey the scope of the invention to those skilled in the art. In the drawings, the size and relative sizes of layers and regions may be exaggerated for clarity. For clarity, like numerals refer to like components.

Exemplary embodiments of the invention may improve the performance of III-Nitride LEDs though the addition of ZnO layers to the LEDs' surfaces. These layers can improve the light extraction, heat dissipation, and current distribution (current spreading) of the device. Structuring, patterning, or roughening of the ZnO layers, either during or subsequent to synthesis, may further improve the light extraction and heat dissipation enhancements possible using these films. Due to growing energy concerns, efficient LED lighting technology is of current and expanding importance. However, the cost of LED lighting remains high and is a major impediment to the greater implementation of the technology. This disclosure is intended to allow the power output, light extraction efficiency, and brightness of III-Nitride light emitting diodes to be increased, without substantially increasing the cost of the device. This can be achieved with the current disclosure by matching or exceeding the performance of other current spreading layers, e.g. ITO or Ni/Au layer, but doing so using an inexpensive raw material, i.e. ZnO, and a low cost deposition method, i.e. low temperature aqueous deposition.

ZnO is an attractive material for use as current spreading layers in III-Nitride based light emitting diodes for multiple reasons. The two materials are structurally and thermally compatible, which allows for the epitaxial growth of ZnO films on III-N surfaces. Zinc oxide is easily produced with high n-type conductivity, which enables a ZnO film to spread current across the surface of a light emitting diode. ZnO is also highly transparent across the entire spectrum of visible light, which prevents absorption of the light generated by the light emitting diode. Furthermore, ZnO selectively etches in various acids that do not damage III-N materials, allowing for facile ZnO film patterning, as well as ZnO surface roughening for enhanced light extraction.

Herein, III-nitrides may be referred to as group III-nitrides, III-N nitrides, or by (Al,Ga,In)N, AlInGaN, or $Al_{(1-x-y)}In_yGa_xN$, where $0<x<1$ and $0<y<1$, for example. These terms are intended to be broadly construed to include respective nitrides of the single species, Al, Ga, and In, as well as binary, ternary and quaternary compositions of such Group III metal species. Accordingly, the terms comprehend the compounds AN, GaN, and InN, as well as the ternary compounds AlGaN, GaInN, and AlInN, and the quaternary compound AlGaInN, as species included in such nomenclature. When two or more of the (Ga, Al, In) component species are present, all possible compositions, including stoichiometric proportions as well as "off-stoichiometric" proportions (with respect to the relative mole fractions present of each of the (Ga, Al, In) component species that are present in the composition), can be employed within the broad scope of the invention.

Accordingly, it will be appreciated that the discussion of the invention hereinafter in primary reference to GaN materials is applicable to the formation of various other (Al, Ga, In)N material species. Further, (Al, Ga, In)N materials within the scope of the invention may further include minor quantities of dopants and/or other impurity or inclusional materials. Boron may also be included in the III-nitride alloy.

Similarly, the terms zinc oxide or ZnO are intended to be broadly construed to include any material where the component species Zn and O make up the majority of the compound, and the material retains the hexagonal Wurtzite crystal structure of ZnO. This is inclusive of aluminum doped zinc oxide (AZO), gallium doped zinc oxide (GZO), and indium doped zinc oxide (IZO). This also includes materials with minor quantities of other dopants and/or other impurity or inclusional materials, as well as materials that are off-stoichiometric due to the presence of vacancy and interstitial type material defects.

Exemplary embodiments of the present invention provide a method of forming an LED including a ZnO layer formed using a Successive Ionic Layer Adsorption and Reaction (SILAR) method. In particular, the SILAR method may be used to produce a thin film that may be used as seed layer (nucleation layer) for subsequent ZnO bulk deposition. However, according to various embodiments, the SILAR method may be used to form a ZnO layer without bulk deposition. Compared to convention methods for producing a nucleation or seed layer, the present SILAR method has several advantages. The similarity of the aqueous solution chemistry used for the SILAR with that used for depositing the bulk of the ZnO film by low temperature aqueous solution deposition simplifies their use together and ensures compatibility of the processes. When used to deposit a seed layer for low temperature aqueous solution deposition of ZnO, the SILAR process provides the same cost, safety, environmental, and scalability advantages intrinsic to low temperature, atmospheric pressure, aqueous solution based processes.

Compared to a conventional aqueous solution-based method for producing a nucleation/seed layer, the SILAR process described here produces a more uniform, higher density of epitaxial seed nuclei on a III-N LED surface. This may produce faster coalescence of a smooth uniform film during subsequent ZnO deposition, and this film should have a stronger and more uniform interface with the III-N surface. The SILAR process also allows for more efficient use of the deposition solutions, as they are virtually unchanged by the deposition process and could be reused for multiple deposition processes. By producing less waste, the SILAR method provides more cost advantage.

FIG. 3 is a box diagram illustrating a method of forming a ZnO seed layer using a Successive Ionic Layer Adsorption and Reaction (SILAR) method, according to an exemplary embodiment of the present invention. Referring to FIG. 3, in step S100, an III-Nitride LED is formed and then the surface thereof is prepared by washing, or another surface preparation method designed to remove any surface contamination, to create desired surface termination, or otherwise produce a surface conducive to film deposition.

In step S200, the surface of the III-Nitride LED is exposed to Solution 1 to promote the formation of ionic inner and outer layers on the surface of the III-Nitride LED. The inner ionic layer may include Zn ions or complexes that are adsorbed onto the III-Nitride LED surface. The outer ionic layer may include counter ions or ionic complexes with a sign of charge opposite to the Zn ions or complexes.

Solution 1 generally includes zinc ions or complexes dissolved in a solvent, such as water. Solution 1 may also include dopants or alloying agents, such as ions or complexes of B, Al, Ga, In, Si, Ge, Sn, Mg, Cd, Li, Na, K, Be, Mg, Ca, Sc, Ti, V, Cr, Mn, Fe, Co, Ni, Cu, Y, Zr, Nb, Mo, and Ag. Other molecules or ions can be added to act as complexing ligands for Zn and or for doping or alloying agent(s). The formation of complexes with such ligands can be used to control the solubility and or hydrolysis behavior of Zn or of doping or alloying agents. The complexing ligand used may be ammonia or another ammine. The appropriate pH, Zn concentration, complexing ligand type, complexing ligand concentration, ionic strength, etc. of Solution 1, as well as the duration and conditions of exposure can be controlled to produce desired film deposition properties.

In step S300, the surface of the III-Nitride LED is washed. The washing may involve applying deionized water or another rinsing solution to the III-Nitride LED, under conditions that rinse away the excess Solution 1 and all or part of the second (outer) ionic layer, but leaves all or part of the inner layer that contains adsorbed Zn ions or complexes. The duration, volume, and flow for the rinse are controlled to produce desired film deposition properties. According to some embodiments, the step S300 may be omitted, which may not prevent the deposition of a ZnO seed layer (film). However, omitting step S300 may diminish the quality of the seed layer.

In step S400, the surface of the III-Nitride LED is exposed to Solution 2, to induce hydrolysis of the Zn ions or complexes absorbed to the III-Nitride LED. The hydrolysis reaction converts the adsorbed Zn ions or complexes into an oxide layer absorbed on the surface of the III-Nitride LED. The oxide layer may include zinc oxide, zinc hydroxide, or a combination or intermediate of the two substances. If other ions or complexes are added to a Solution 1 for doping or alloying, those ions or complexes may also be hydrolyzed and incorporated into the material formed on the surface. The appropriate composition, pH, temperature, etc., of Solution 2, as well as the duration and nature of the exposure can be determined experimentally to give the desired film deposition properties.

In step S500, the III-Nitride LED is washed to rinse away the excess Solution 2 and/or cool the surfaces thereof. The washing may involve applying deionized water or another rinsing solution to the III-Nitride LED. The duration, volume, and flow used for the wash can be determined experimentally to give the desired film deposition properties.

According to some embodiments, step S500 may be omitted. Omitting step S500 may not prevent the deposition of a ZnO film, but may diminish the quality of the film.

In step S600, steps S200 through S500 are repeated for one or more cycles to deposit additional material. When step S200 is repeated after the completion of step S500, the Zn ions or complexes are absorbed onto the zinc oxide/hydroxide surface formed after step S400. With each additional cycle, a new layer of Zn ions or complexes is hydrolyzed into zinc oxide/hydroxide, adding to the thickness of the oxide layer. The degree of coalescence and crystal quality may also be increased.

In step S700, the III-Nitride LED is annealed. The annealing may remove or fully convert remaining zinc hydroxide, densify and/or improve the crystal quality of the film, and/or improve the mechanical and electrical properties of the interface between the III-Nitride surface and the ZnO film. The temperature, duration, heating/cooling rates, and ambient conditions for the annealing can be controlled to provide desired film properties.

According to some embodiments, step S700 may be omitted. However, the above benefits may not be realized if step S700 is omitted. The ZnO film formed by the steps S100 through S700 may have an epitaxial structure with respect to the crystal structure of the III-Nitride LED surface.

Hereinafter, SILAR deposition, according to exemplary embodiments of the present invention, will be described in detail through the following Experimental Example 1.

Experimental Example 1

A semiconductor wafer including III-Nitride LEDs disposed on a sapphire substrate was prepared for SILAR deposition by ultrasonication in acetone, followed by ultrasonication in isopropyl alcohol, followed by rinsing thoroughly with deionized water, followed by a 60 second submersion in concentrated (35-38 wt %) hydrochloric acid solution, followed by immersion in stirred 90-100° C. deionized (DI)

water for 10 seconds, then emersion in flowing and stirred room temperature deionized water for 30 seconds.

The prepared wafer was submerged in room temperature, stirred Solution 1, for 10 seconds. Solution 1 included an aqueous solution of 0.05 mol/L $Zn(NO_3)_2$, 0.25 mol/L $NH_4NO_3$, 0.25 mol/L $NH_4OH$, which possesses a room temperature pH of approximately 9. The wafer was washed by being submerged in flowing and stirred room temperature deionized water for 30 seconds.

The wafer was then submerged in a stirred Solution 2, including 90-100° C. deionized water, for 10 seconds. The wafer was washed and cooled by being submerged in flowing and stirred room temperature deionized water for 30 seconds.

The application of Solution 1, the $1^{st}$ washing, the application of Solution 2, and the $2^{nd}$ washing were repeated for 1 to 30 additional cycles. After the cycles were completed, the wafer was dried with filtered nitrogen gas. Once dried, the wafer was placed on a hotplate under flowing nitrogen gas, and the temperature of the hotplate was gradually increased from room temperature to a temperature of 500° C. at a rate of 25° C./minute. The wafer was held at 500° C. for 15 minutes before cooling. Then resultant ZnO film (seed layer) was used as for the subsequent deposition of Ga-Doped ZnO, by a low temperature aqueous solution deposition method.

Figure 4:
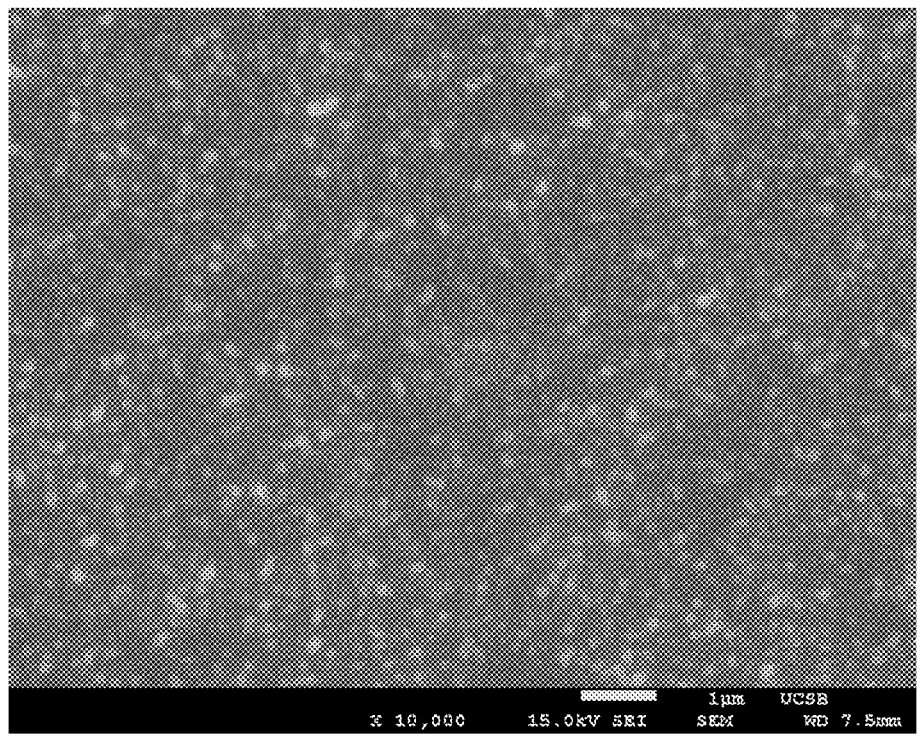
FIGS. 4 and 5 are electron micrographs of ZnO seed layers, according to various embodiments of the present invention.
Figure 5:
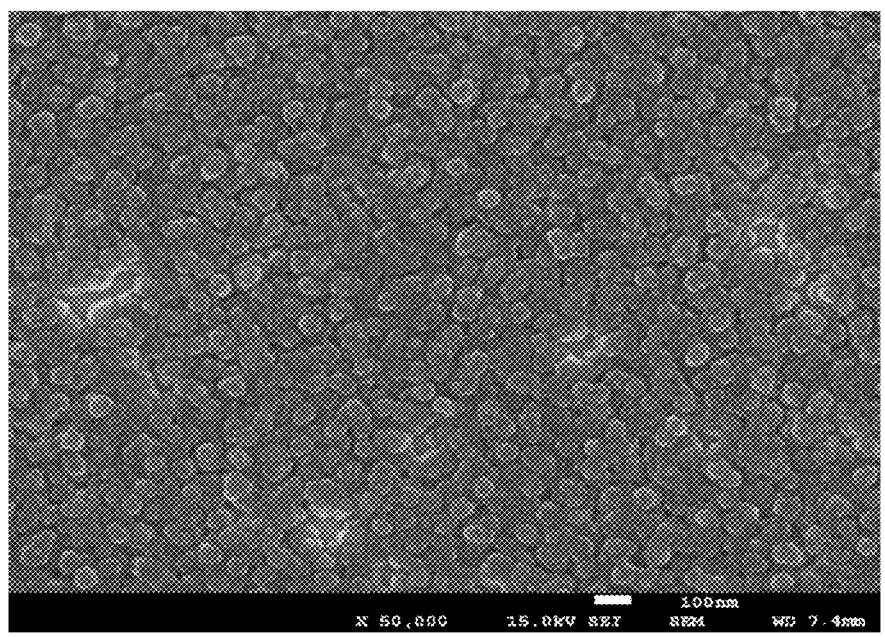
Figure 6:
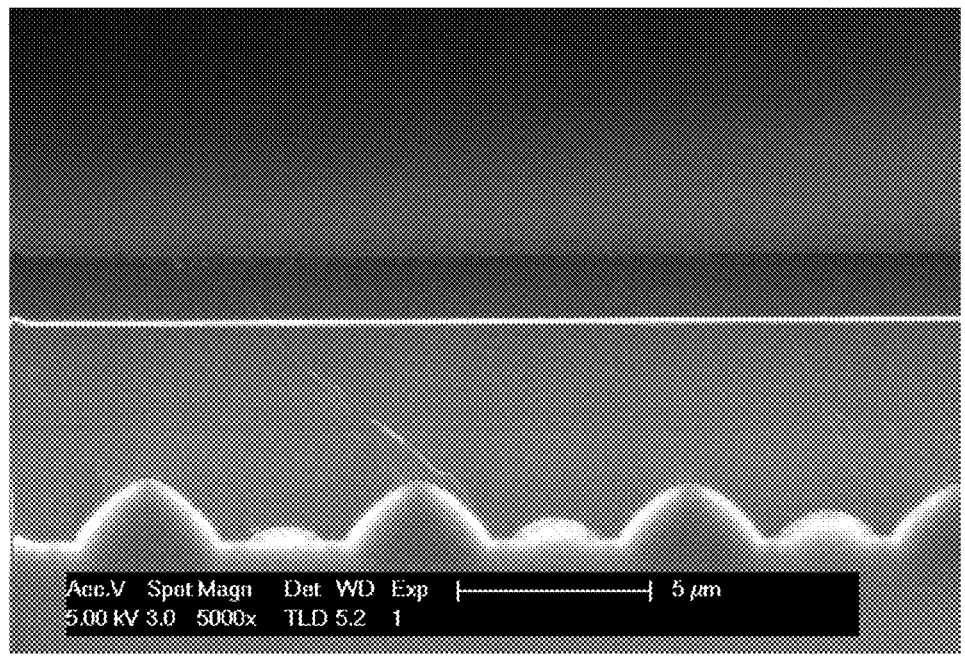
FIG. 6 is an electron micrograph showing a cross-section of a thick ZnO film produced by low temperature aqueous deposition utilizing a SILAR deposited ZnO seed layer, according to an exemplary embodiment of the present invention.

FIGS. 4 and 5 show electron micrographs of the seed layer produced in Example 1, using 30 cycles of the SILAR method. FIG. 6 shows an electron micrograph of a cross-section of the wafer after the subsequent deposition of a thicker Ga-Doped ZnO film by low temperature aqueous solution deposition. As can be seen in the micrographs, the seed layer had improved uniformity and surface coverage, as compared to the related art seed layer shown in FIG. 2.

Figure 7:
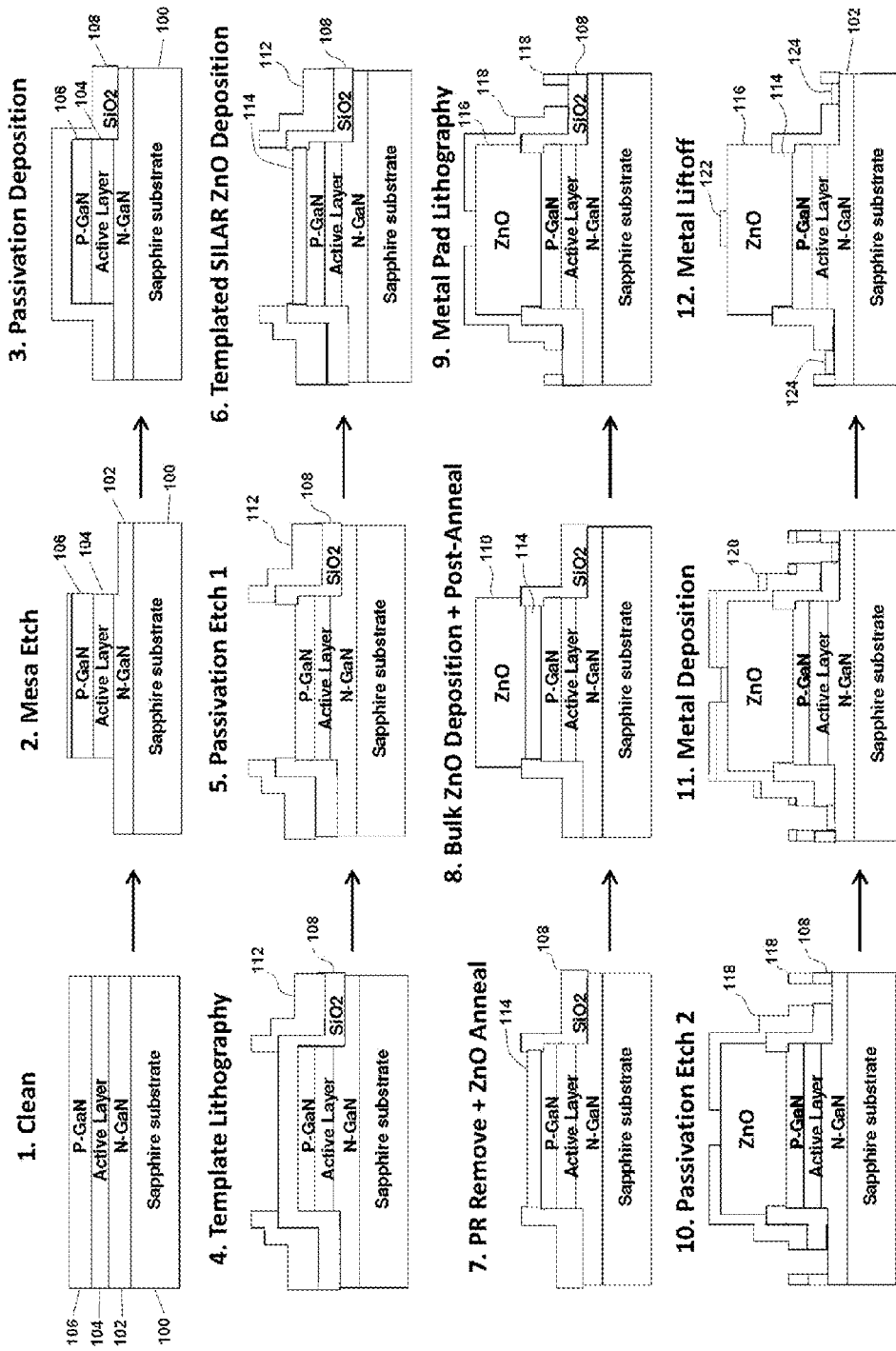
FIG. 7 illustrates a method of forming an LED including a ZnO layer formed using a template, according to an exemplary embodiment of the present invention.

FIG. 7 illustrates a method of forming an LED including a ZnO layer 116, according to an exemplary embodiment of the present invention. Referring to FIG. 7, in step 1, a semiconductor wafer is cleaned. The wafer includes a sapphire substrate 100, an N-doped Gallium Nitride (N-GaN) layer 102, an active layer 104, and a P-doped Gallium Nitride (P-GaN) layer 106. However, any suitable semiconductor layers may be used, and/or the arrangement of the layers may be altered. The cleaning may include exposing the wafer to Piranha Etch solution (a heated mixture of sulfuric acid and hydrogen peroxide), then rinsing with deionized water, followed by exposure to a buffered oxide etchant solution (pH buffered hydrofluoric acid), and a final rinse with deionized water. According to some embodiments, the washing step may be similar to that described with regard to FIG. 3.

In step 2, the wafer is mesa etched to remove portions of the P-GaN layer 106 and the active layer 104, and to expose portions of the N-GaN layer 102. As a result, a mesa or island structure is formed. The etching may be performed using a dry etching method. However, any suitable semiconductor etching method may be used. Although not shown, the etching may produce a plurality of mesa structures on the wafer.

In step 3, a passivation layer 108 including an insulating material, such as $SiO_2$, is formed on the wafer. In particular, the passivation layer 108 is formed to cover exposed portions of the P-GaN layer 106, the active layer 104, and the N-GaN layer 102. According to various embodiments, the passivation layer 108 may be formed of any suitable material, and thus, is not limited to $SiO_2$.

In step 4, a first photoresist layer 112 is formed on the passivation layer 108. In particular, a photoresist material may be coated on the substrate, patterned via UV light exposure, and then developed. However, the present invention is not limited to any particular method of forming the first photoresist layer 112. As a result, the first photoresist layer 112 forms a mask that exposes a portion of the passivation layer 108 covering the P-GaN layer 106.

In step 5, the wafer is etched to remove the exposed portion of the passivation layer 108. As a result, a portion of the P-GaN layer 106 is exposed. The etching of the passivation layer 108 may be performed using a wet etchant, such as, hydrofluoric acid (HF) or a buffered oxide etchant (BOE), or a dry etch.

In step 6, a seed layer 114 is formed on the exposed portion of the P-GaN layer 106. In particular, the seed layer 114 includes a ZnO film and is deposited using a SILAR method, as described above. During the SILAR deposition, the seed layer 114 is deposited only on the P-GaN layer 106, since the patterned first photoresist layer 112 and passivation layer 108 operate as a template. In particular, the seed layer 114 is not formed on the first photoresist layer 112 because the hydrophobic non-polar nature of the photoresist does not promote adsorption of the Zn complexes in aqueous solution.

Figure 8:
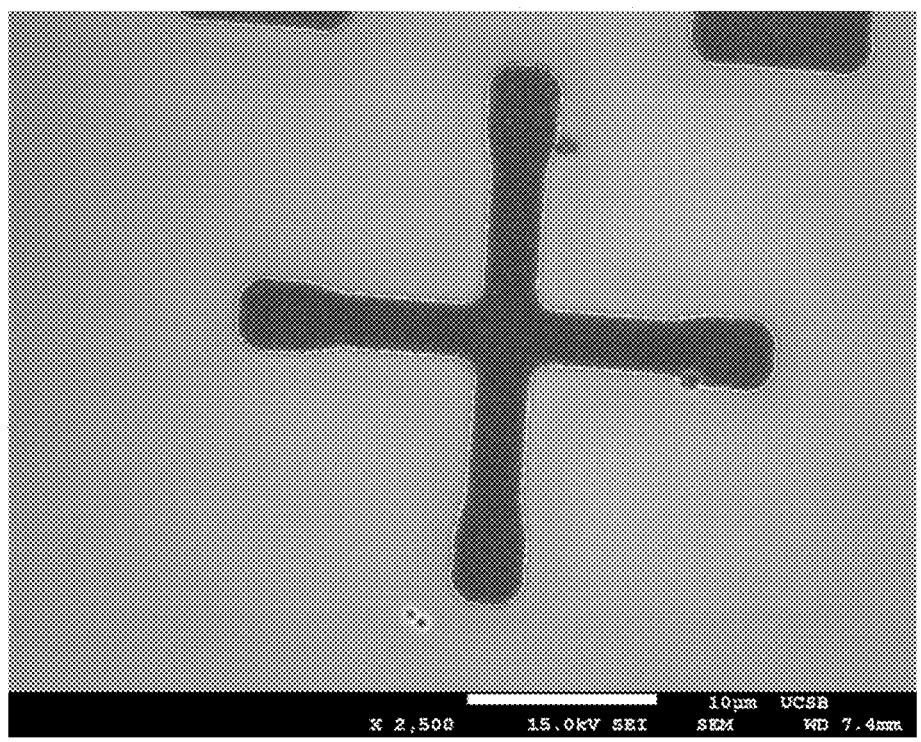
FIG. 8 is an electron micrograph showing a ZnO layer formed using the method of FIG. 7.

FIG. 8 illustrates and electron micrograph of a ZnO seed layer formed using 30 cycles of SILAR and a template, as described in steps 1-6. Thus, as shown in FIG. 8, a patterned seed layer may be formed.

Referring again to FIG. 7, in step 7, the first photoresist layer 112 is removed, and the wafer is annealed. The first photoresist layer 112 may be removed by dissolution in acetone or any other suitable solvent. The annealing may be performed as described above with regard to FIG. 3.

In step 8, a bulk deposition process is performed to form a ZnO bulk layer 110 on the seed layer 114. In particular, the bulk layer 110 may be formed by a low temperature aqueous deposition process, as described in U.S. Patent Application No. 2011/0101414, which is incorporated herein by reference. The passivation layer 108 may operate as a template, thereby controlling the formation of the bulk layer 110 and the seed layer 114. In other words, the template allows for ZnO to be deposited in specific locations on the wafer.

Once the bulk layer 110 is formed, the wafer may be annealed a second time. This anneal is meant to alter the properties of the ZnO film by improving crystallinity, removing defects, decomposing residual zinc hydroxide, activating dopants, etc. In step 8, the seed layer 114 and the bulk layer 110 are show as being distinct layers for illustration purposes. However, there is generally no distinct boundary between the seed layer 114 and the bulk layer 110. Thus, as shown in step 9, the seed layer 114 and the bulk layer 110 are referred to as a single ZnO layer 116.

In step 9, a second photoresist layer 118 is formed on the wafer. The second photoresist layer 118 is patterned to expose portions of the ZnO layer 116 and the passivation layer 108. The second photoresist layer 118 may be patterned by photolithography or any other suitable method. Thus, the second photoresist layer 118 may be formed in a manner similar to the manner in which the first photoresist layer 112 is formed.

In step 10, the wafer is etched to remove the exposed portions of the passivation layer 108. The etchant used during the etching process may have a higher etching selectivity with respect to the passivation layer 108 than with respect to the ZnO layer 116. As such, the exposed portion of the ZnO layer 116 is not substantially affected by the etching process. The etching process used may be a dry etch, for example. However, any suitable etch process may be used.

In step 11, a metal layer 120 is formed on the wafer. The metal layer 120 may include any suitable metal or alloy having good conductivity and/or that forms a low resistance Ohmic contact with the ZnO and the N-GaN layers.

In step 12, the second photoresist layer 118 and the portions of the metal layer 120 disposed thereon are removed.

The removal process may involve a lift-off process using a photoresist stripper, or any other suitable method. As a result a P-pad 122 is formed on the ZnO layer 116, and N-pads are formed on the N-GaN layer 102, thereby completing the LED. According to various embodiments, the LED may be a III-Nitride LED. However, the present invention is not limited thereto. For example, the present method may be applied to a III-Nitride photovoltaic device.

As noted above, a number of the LEDs can be formed on the wafer. Thus, once the LEDs are completed, the LEDs may be separated by, for example, scoring and breaking the substrate 100. However, any suitable separation process may be used.

Figure 9A:
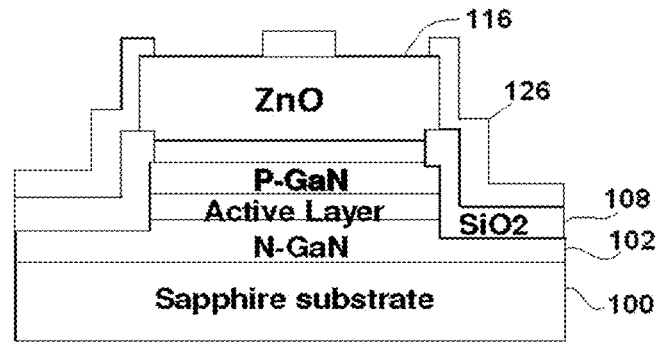
FIGS. 9A and 9B illustrate additional steps that may be included in the method of FIG. 7, according to exemplary embodiments of the present invention.
Figure 9B:
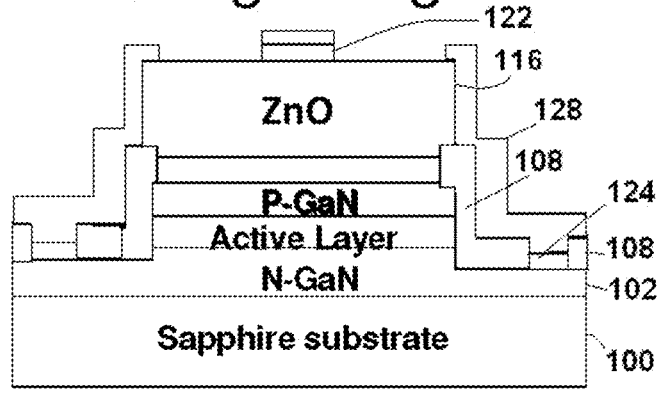

FIGS. 9A and 9B illustrate additional steps that may be applied to the method of FIG. 7. Referring to FIG. 9A, step 8.5 may be performed between steps 8 and 9. In particular, step 8.5 includes forming a photoresist layer 126 on the wafer. The photoresist layer 126 is patterned to expose portions of the ZnO layer 116. For example, portions of the upper surface of the ZnO layer 116, other than a portion where the P-pad 122 will be formed, are exposed by the patterning.

After the photoresist layer 126 is formed, the wafer is etched to roughen the exposed portions of the ZnO layer 116. The etching may include applying an etchant such as dilute hydrochloric acid (HCl), 0.05 Normality, for example, to the wafer, for a time period of from 10 seconds to 2 minutes. As such, the surface roughness of the ZnO layer 116 is increased, thereby improving light extraction efficiency. In addition, the photoresist layer 126 protects sidewalls of the ZnO layer 116 and the portion where the P-pad 122 will be formed.

Referring to FIG. 9B, step 13 may be performed after step 12. In particular, step 13 includes forming a photoresist layer 128 on the wafer. The photoresist layer 128 is patterned to expose portions of the ZnO layer 116. For example, portions of the upper surface of the ZnO layer 116, other than where the P-pad 122 is formed, are exposed by the patterning. After the photoresist layer 128 is formed, the wafer is etched to roughen the exposed portions of the ZnO layer 116, while protecting sidewalls of the ZnO layer 116, the P-pad 122, and the N-pads 124. This etching may be performed in a similar manner to the etching described with regard to FIG. 9A.

Figure 10:
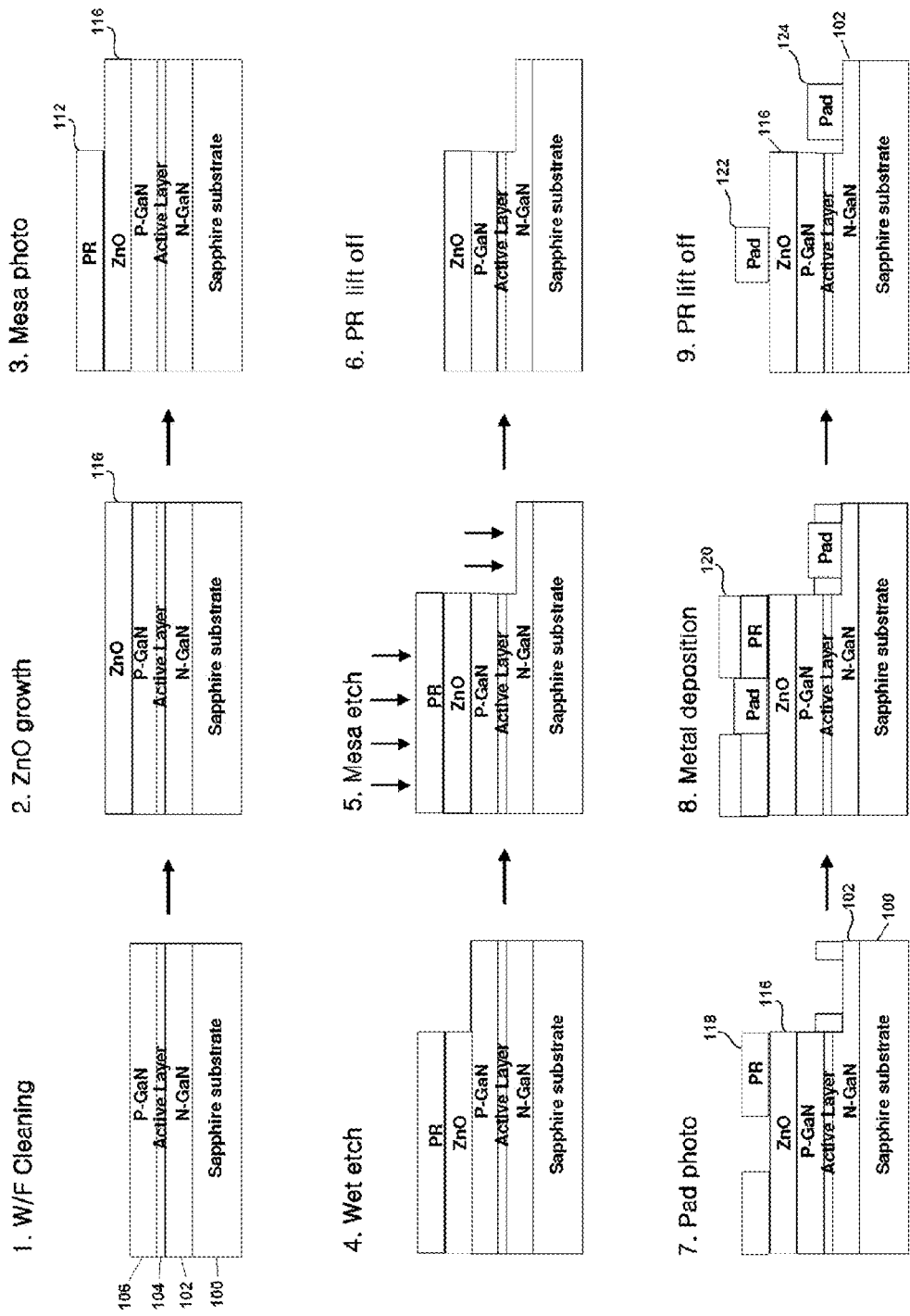
FIG. 10 illustrates a method of forming an LED including a ZnO layer formed without a template, according to an exemplary embodiment of the present invention.

FIG. 10 illustrates a method of forming an LED comprising a ZnO layer, according to an exemplary embodiment of the present invention. Aspects of the method that are similar to the method of FIG. 7 will not be described in detail. Referring to FIG. 10, in step 1, a semiconductor wafer is cleaned. The wafer includes a sapphire substrate 100, an N-doped Gallium Nitride (N-GaN) layer 102, an active layer 104, and a P-doped Gallium Nitride (P-GaN) layer 106. However, any suitable semiconductor layers may be used, and/or the arrangement of the layers may be altered. The cleaning may be similar to the cleaning in step 1 of FIG. 7.

In step 2, a ZnO layer 116 is formed on the P-GaN layer 106. The ZnO layer 116 is formed by depositing a seed layer using SILAR and then depositing a bulk layer on the seed layer, using a low-temperature aqueous deposition method. The annealing processes described with respect to FIG. 7, Steps 7 and 8 may respectively performed after the SILAR and bulk ZnO depositions. As such, the formation of the ZnO layer 116 is similar to the process described in FIG. 7, except that a template is not used.

In step 3, a first photoresist layer 112 is formed on the ZnO layer 116. The first photoresist layer 112 is patterned using, for example, UV light exposure, and then developed to expose a portion of the ZnO layer 116. In step 4, the wafer is wet etched to remove the exposed portions of the ZnO layer 116. The wet etch may be performed using a dilute acid, such as a mixture of $H_3PO_4$ and DI water, or the like. The $H_3PO_4$ and DI water may be mixed at a ratio of about 1:600, for example.

In step 5, the wafer is dry etched to completely remove portions of the P-GaN layer 106 and the active layer 104, thereby exposing the N-GaN layer 102. In step 6, the first photoresist layer 112 is removed using a solvent/stripping composition, as described in the method of FIG. 7.

In step 7, a second photoresist layer 118 is formed on the wafer. The second photoresist layer 118 is formed by coating a photoresist material on the wafer, which is then patterned to expose portions of the ZnO layer 116 and the N-GaN layer 102. In step 8, a metal layer 120 is deposited on wafer. The metal layer 120 may be deposited using an electron beam deposition method, for example. However, the present invention is not limited to any particular deposition process.

In step 9, the second photoresist layer 118 is removed, thereby removing portions of the metal layer 120 disposed thereon. Remaining portions of the metal layer 120 form a P-pad 122 on the ZnO layer 116 and an N-Pad 124 on the N-GaN layer 102. The surface roughening processes described at FIGS. 9A and 9B may be applied to any of the embodiments disclosed herein.

Figure 11A:
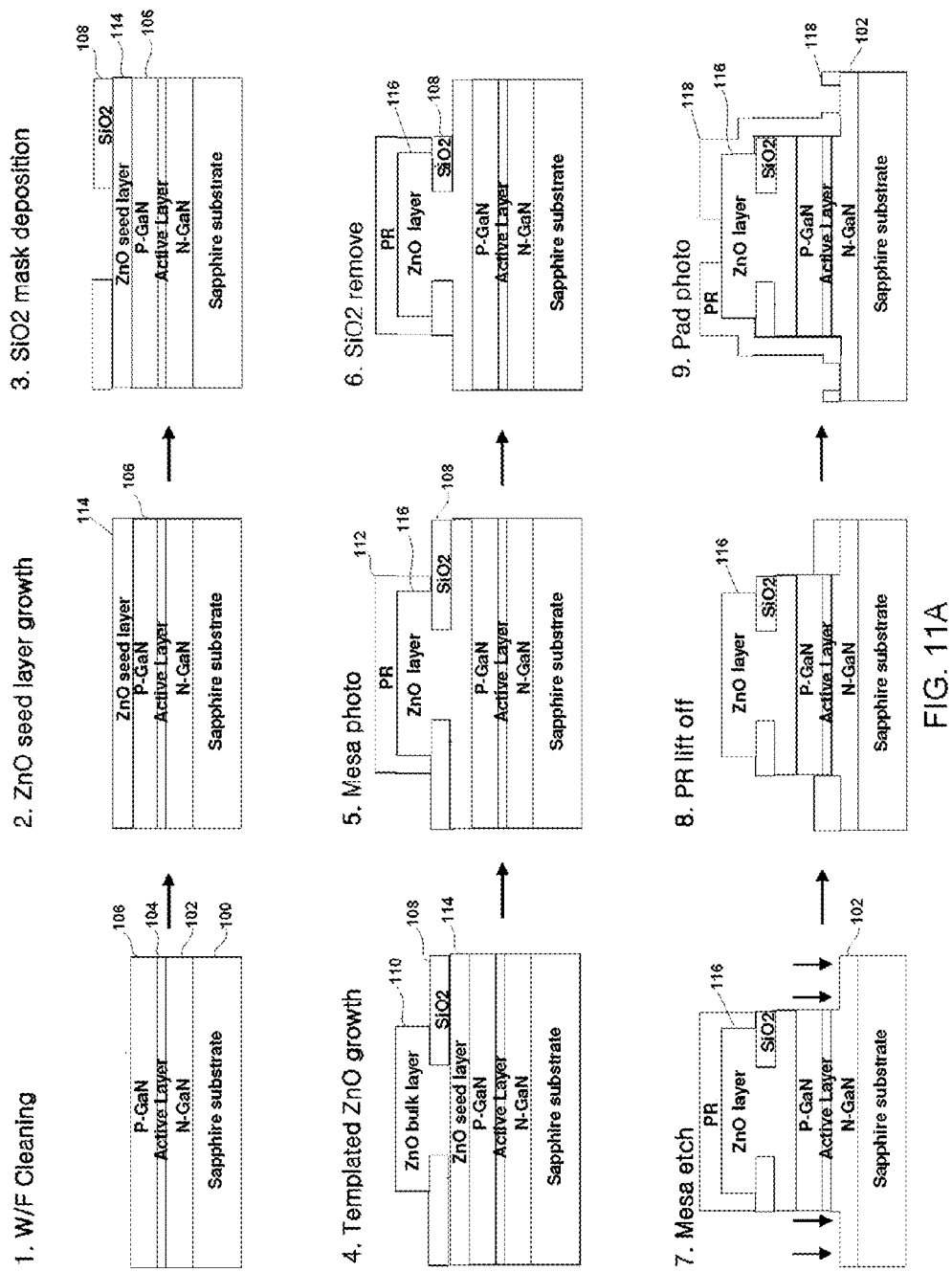

FIGS. 11A and 11B illustrate a method of forming an LED comprising a ZnO layer, according to an exemplary embodiment of the present invention. Referring to FIG. 11A, in step 1 of the method, a semiconductor wafer is cleaned. The wafer includes a sapphire substrate 100, an N-doped Gallium Nitride (N-GaN) layer 102, an active layer 104, and a P-doped Gallium Nitride (P-GaN) layer 106. However, any suitable semiconductor layers may be used, and/or the arrangement of the layers may be altered. The cleaning may be similar to the cleaning in step 1 of FIG. 7.

In step 2, a ZnO seed layer 114 is formed on the P-GaN layer 106. The seed layer 114 is deposited by a SILAR process. The wafer may then be annealed, as described in the method of FIG. 7.

In step 3, a passivation layer 108 comprising $SiO_2$ is deposited on the wafer. The passivation layer 108 may be patterned by a lift off process, similar to that described in Steps 7 and 8 of FIG. 10 for the metal layer, or by an etching process, similar to that described in Step 10 of FIG. 7. By patterning, the $SiO_2$ layer forms a template, exposing a portion of the seed layer 106 for further ZnO deposition.

In step 4, a ZnO bulk layer 110 is formed on the wafer using a low-temperature aqueous deposition, as described in the method of FIG. 7. As shown in step 4, the bulk layer 110 is formed on the exposed portion of the seed layer 114. In addition, the bulk layer 110 may overlap portions of the passivation layer 108 adjacent to the exposed portion of the seed layer 114, by a lateral epitaxial overgrowth mechanism. Following deposition, the wafer may be annealed as described in the method of FIG. 7.

In step 5, a first photoresist layer 112 is formed on wafer. The first photoresist layer 12 is patterned so as to cover the ZnO layer 116 and expose portions of the passivation layer 108. In step 6, the wafer is etched to remove the exposed portion of the passivation layer 108 and to expose portions of the ZnO layer 116. As a result, portions of the P-GaN layer 106 are exposed.

In step 7, the wafer is dry etched to completely remove the exposed portions of the ZnO layer 116 and underlying portions of P-GaN layer 106 and the active layer 104, thereby exposing portions of the N-GaN layer 102. As a result a mesa or island structure is formed.

In step 8, the first photoresist layer 112 is removed, as described in the method of FIG. 7. As a result, the ZnO layer 116 is exposed. In step 9, a second photoresist layer 118 is coated on the wafer. The second photoresist layer 118 is then patterned by, for example, exposure to UV light, and then developed to expose portions of the ZnO layer 116 and the N-GaN layer 102.

Referring to FIG. 11B, in step 10, a metal layer 120 is deposited on the wafer. The metal layer 120 may be deposited using an electron beam deposition method, for example. In step 11, the second photoresist layer 118 and the portions of the metal layer 120 disposed thereon are removed. The removal process may involve applying a solvent/stripping composition, or any other suitable method. As a result, a P-pad 122 is formed on the ZnO layer 116, and N-pads 124 are formed on the N-GaN layer 102, thereby completing the LED. According to various embodiments, the LED may be a III-Nitride LED. However, the present invention is not limited thereto.

Figure 12A:
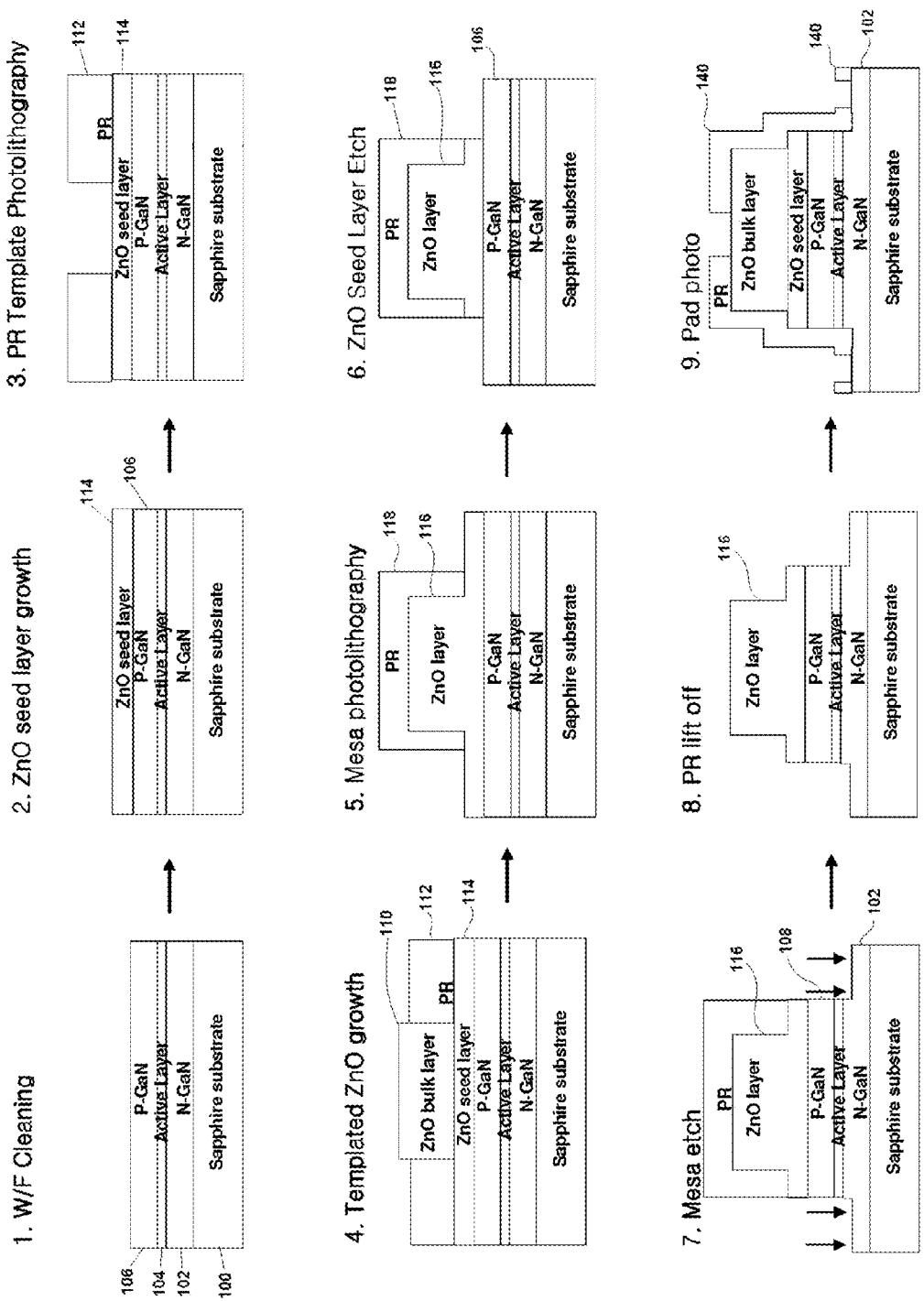
FIGS. 12A and 12B illustrate a method of forming an LED including a ZnO layer, according to an exemplary embodiment of the present invention.
Figure 12B:
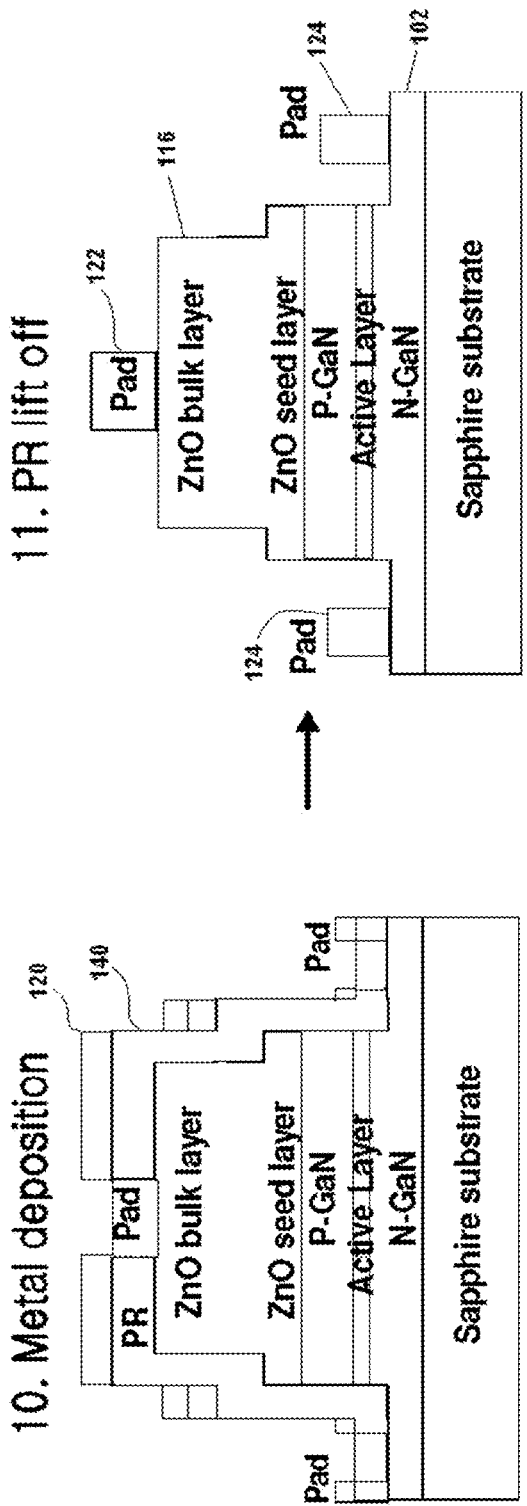

FIGS. 12A and 12B illustrate a method of forming an LED comprising a ZnO layer, according to an exemplary embodiment of the present invention. Referring to FIG. 12A, in step 1 of the method, a semiconductor wafer is cleaned. The wafer includes a sapphire substrate 100, an N-doped Gallium Nitride (N-GaN) layer 102, an active layer 104, and a P-doped Gallium Nitride (P-GaN) layer 106. However, any suitable semiconductor layers may be used, and/or the arrangement of the layers may be altered. The cleaning may be similar to the cleaning in step 1 of FIG. 7.

In step 2, a seed layer 114 is formed on the upper surface of the P-GaN layer 106. In particular, the seed layer 114 includes a ZnO film and is deposited using the SILAR method described above. Once deposited, the seed layer 114 may be annealed as described above.

In step 3, a first photoresist layer 112 is formed on the wafer. In particular, a photoresist material is coated on the wafer, exposed with UV light, and then developed, so as to form a template exposing a portion of the seed layer 114.

In step 4, a ZnO bulk layer 110 is formed on the wafer using a low-temperature aqueous deposition, as described in the method of FIG. 7. As shown in step 4, the bulk layer 110 is formed on the exposed portion of the seed layer 114. After ZnO deposition, the first photoresist layer 112 is removed and the wafer may then be annealed as described in the method of FIG. 7.

In step 5, a second photoresist layer 118 is formed on the wafer. In particular, a photoresist material is coated on the wafer, patterned using UV light, and then developed. As such, the second photoresist layer 118 exposes portions of the ZnO seed layer 114.

In step 6, the wafer is etched. In particular, the etching removes the exposed portions of the ZnO layer seed layer 114, thereby exposing portions of the P-GaN layer 106. The etching may be a wet etching process and the etchant may be a dilute acid.

In step 7, the wafer is further etched. In particular, the wafer is dry etched to completely remove the exposed portions of the P-GaN layer 106 and portions of active layer 104, thereby exposing the underlying N-GaN layer 102. In step 8, the photoresist layer 118 is removed.

In step 9, a third photoresist layer 140 is formed on the wafer. In particular, a photoresist material is coated on the wafer, patterned using UV light, and then developed. As such, the third photoresist layer 140 forms a template exposing portions of the ZnO layer 116 and the N-GaN layer 102.

In step 10, a metal layer 120 is deposited on the wafer. In particular, the metal layer 120 may be deposited by electron beam deposition or any other suitable method. The metal layer 120 may be formed directly on the upper surface of the third photoresist layer 140 and the exposed portions of the ZnO layer 116 and the N-GaN layer 102.

In step 11, the third photoresist layer 140 and portions of the metal layer 120 disposed thereon are removed. As a result, remaining portions of the metal layer 120 from a P-pad 122 disposed on the ZnO layer 116 and N-Pads 124 disposed on the N-GaN layer 102, thereby completing the LED. According to various embodiments, the LED may be a III-Nitride LED. However, the present invention is not limited thereto.

Figure 13:
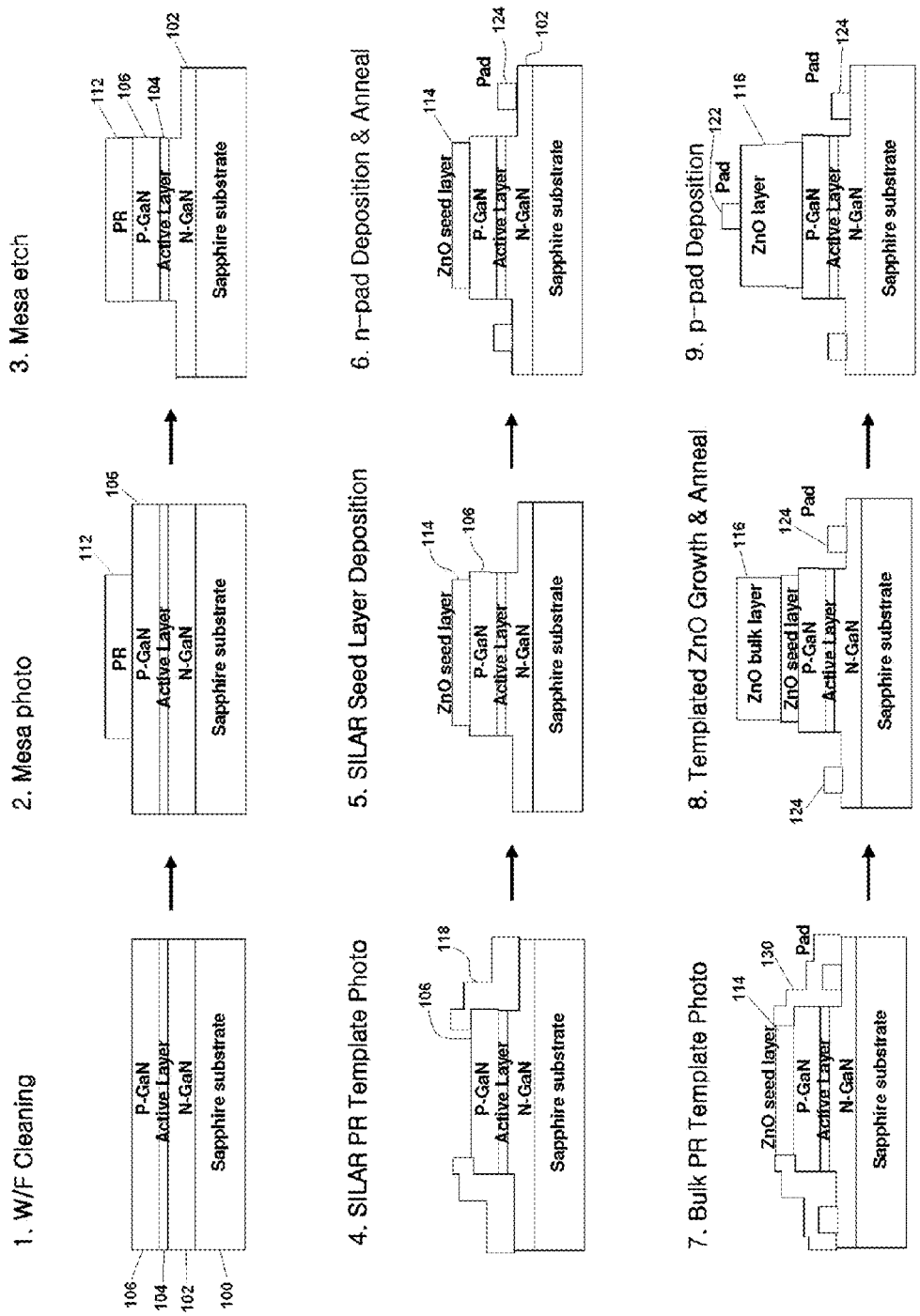
FIG. 13 illustrates a method of forming an LED including a ZnO layer, according to an exemplary embodiment of the present invention.

FIG. 13 illustrates a method of forming an LED comprising a ZnO layer, according to an exemplary embodiment of the present invention. Referring to FIG. 13, in step 1 of the method, a semiconductor wafer is cleaned. The wafer includes a sapphire substrate 100, an N-doped Gallium Nitride (N-GaN) layer 102, an active layer 104, and a P-doped Gallium Nitride (P-GaN) layer 106. However, any suitable semiconductor layers may be used, and/or the arrangement of the layers may be altered. The cleaning may be similar to the cleaning in step 1 of FIG. 7.

In step 2, a first photoresist layer 112 is formed on the wafer. In particular, a photoresist material is coated on the wafer, exposed with UV light, and then developed, so as to form a template exposing portions of the P-GaN layer 106.

In step 3, the wafer is mesa etched using a dry etching process. In particular, the wafer is dry etched to completely remove the exposed portions of the P-GaN layer 106 and portions of active layer 104, exposing the underlying N-GaN layer 102.

In step 4, the first photoresist layer 112 is removed by, for example, using a solvent. Then, a second photoresist layer 118 is formed on the wafer. In particular, a photoresist material is coated on the wafer, patterned using UV light, and then developed. As such, the second photoresist layer 118 exposes a portion of the P-GaN layer 106.

In step 5, a seed layer 114 is deposited using the SILAR method. In particular, the second photoresist layer 118 is used as a template during the formation of the seed layer 114. Then, the second photoresist layer 118 is removed and the seed layer 114 is annealed.

In step 6, metal N-pads 124 are deposited on the exposed portion of the N-GaN layer 102. In particular, the N-Pads 124 are formed by the photoresist patterning and lift off process described in the metal deposition steps of the previous figures. This allows the N-pads 124 to be annealed, thereby lowering the contact resistance thereof.

In step 7, a third photoresist layer 130 is formed on the wafer. In particular, the third photoresist layer 130 may be formed by coating a photoresist material on the wafer, exposing the material to UV light, and then developing the same. As a result, the third photoresist layer 130 forms a template exposing the seed layer 114.

In step 8, a ZnO bulk layer 116 is formed on the seed layer using a low-temperature aqueous method. The third photoresist layer 130 is then removed and the wafer is annealed. Thus, as shown in step 9, a substantially continuous ZnO layer 116 is formed. In step 9, a P-pad 122 is formed on the ZnO layer 116. As such, the LED is completed. The P-pad 122 may be formed by the lift-off process discussed above.

Figure 14:
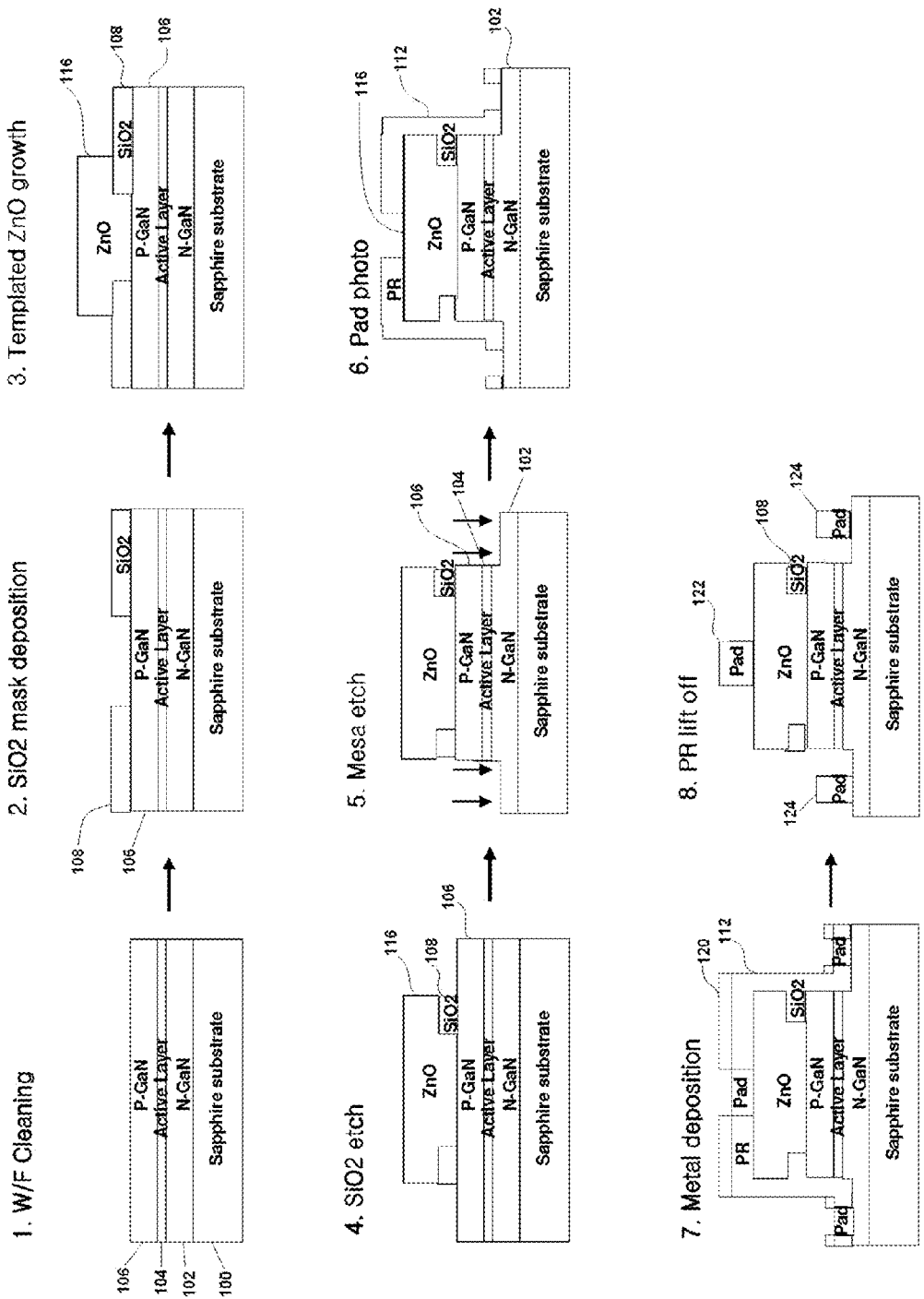
FIG. 14 illustrates a method of forming an LED including a ZnO layer, according to an exemplary embodiment of the present invention.

FIG. 14 illustrates a method of forming an LED comprising a ZnO layer, according to an exemplary embodiment of the present invention. Referring to FIG. 14, in step 1 of the method, a semiconductor wafer is cleaned. The wafer includes a sapphire substrate 100, an N-doped Gallium Nitride (N-GaN) layer 102, an active layer 104, and a P-doped Gallium Nitride (P-GaN) layer 106. However, any suitable semiconductor layers may be used, and/or the arrangement of the layers may be altered. The cleaning may be similar to the cleaning in step 1 of FIG. 7.

In step 2, a passivation layer 108 is formed on the wafer. The passivation layer 108 may be formed by depositing a layer of SiO2, and then patterning the same to expose the upper surface of the P-GaN layer 106. As such, the passivation layer 108 may operate as a template layer for subsequent ZnO deposition.

In step 3, a ZnO layer 116 is formed on the exposed portion of the P-GaN layer 106. The ZnO layer 116 is formed by depositing a seed layer using a SILAR method, and then depositing a bulk layer on the seed layer using a low-temperature aqueous deposition method. As such, the formation of the ZnO layer 116 is similar to the process described in FIG. 7. It is noted the portions of the ZnO layer 116 may overlap portions of the passivation layer 108.

In step 4, the wafer is etched. In particular, the wafer is dry etched using the ZnO layer 116 as a mask. As such, portions of the passivation layer 108 are removed, there by exposing portions of the P-GaN layer 106.

In step 5, the wafer is mesa etched. In particular, the wafer is dry etched to completely remove the exposed portions of the P-GaN layer 106 and portions of active layer 104, exposing the underlying N-GaN layer 102. In step 5, the ZnO layer 116 operates as a mask during the etching.

In step 6, a first photoresist layer 112 is formed on the wafer. In particular, a photoresist material is coated on the wafer, patterned using UV light, and then developed. As such, the first photoresist layer 112 exposes portions of the ZnO layer 116 and the N-GaN layer 102.

In step 7, a metal layer 120 is formed on the wafer. In particular, the metal layer 120 may be deposited by electron beam deposition or any other suitable method. The metal layer may be disposed directly on the upper surface of the first photoresist layer 112 and the exposed portions of the ZnO layer 116 and the N-GaN layer 102.

In step 8, the first photoresist layer 112 and the portions of the metal layer 120 disposed thereon, are removed. As a result, a P-pad 122 is formed on the ZnO layer 116, and N-pads 124 are formed on the N-GaN layer 102, thereby completing the LED. According to various embodiments, the LED may be a III-Nitride LED. However, the present invention is not limited thereto.

Figure 15:
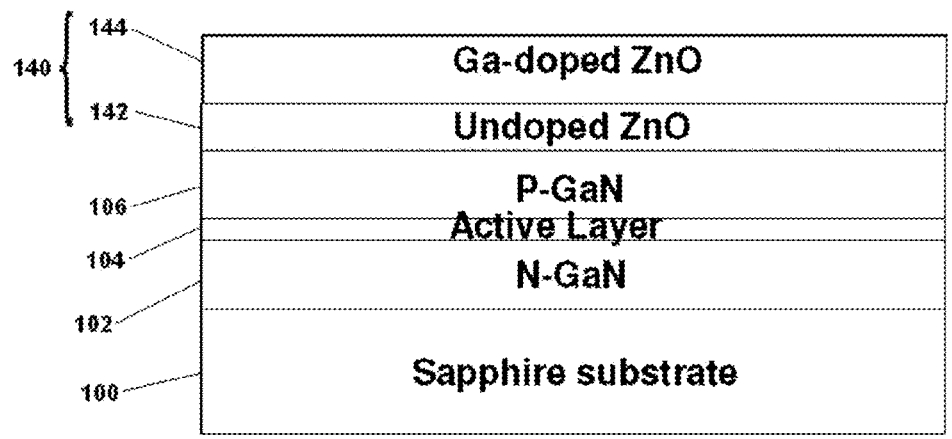
FIG. 15 illustrates an LED including a composite ZnO layer, according to an exemplary embodiment of the present invention.

FIG. 15 illustrates a schematic LED wafer cross-section, according to an exemplary embodiment of the present invention. The LED wafer includes a sapphire substrate 100, an N-doped Gallium Nitride (N-GaN) layer 102, an active layer 104, and a P-doped Gallium Nitride (P-GaN) layer 106. However, any suitable semiconductor layers may be used, and/or the arrangement of the layers may be altered.

In addition, the LED includes a composite ZnO layer 140 disposed on the P-GaN layer 106. The composite layer 140 includes a first ZnO layer 142 disposed on the P-GaN layer 106, and a second ZnO layer 144 disposed on the first ZnO layer 142. The first ZnO layer 142 may have a relatively low conductivity, and the second ZnO layer 144 may have a relatively high conductivity.

For convenience of illustration, the composite ZnO layer 140 is shown to include only two ZnO layers. However, the composite ZnO layer 140 may include a plurality of alternately stacked high and low conductivity ZnO layers. The high electrical conductivity layers, such as the second ZnO layer 144, impart a low electrical sheet resistance to the composite ZnO layer 140. The low conductivity layers, such as the first ZnO layer 142, impart a high electrical resistance to current passing through the composite ZnO layer 140. The combination of low sheet resistance and high through resistance results in more uniform current spreading in the composite ZnO layer, when applied to a III-Nitride LED.

According to some embodiments, the low electrical conductivity layers may include undoped ZnO or ZnO doped with electrically compensating dopants. The low conductivity layers may also be doped or alloyed to increase the semiconductor band gap of the ZnO. The dopant may be Mg, or the ZnO may be alloyed with MgO. The high electrical conductivity layers may be n-type doped ZnO, where the dopant is B, Al, Ga, In, H, F, Cl, etc. One or more of the high and low conductivity ZnO layers may be deposited by low temperature aqueous solution onto a seed layer deposited by the SILAR method. One or more of the high conductivity layers and/or one or more of the low conductivity layers may be deposited by a SILAR method as described above.

Figure 16:
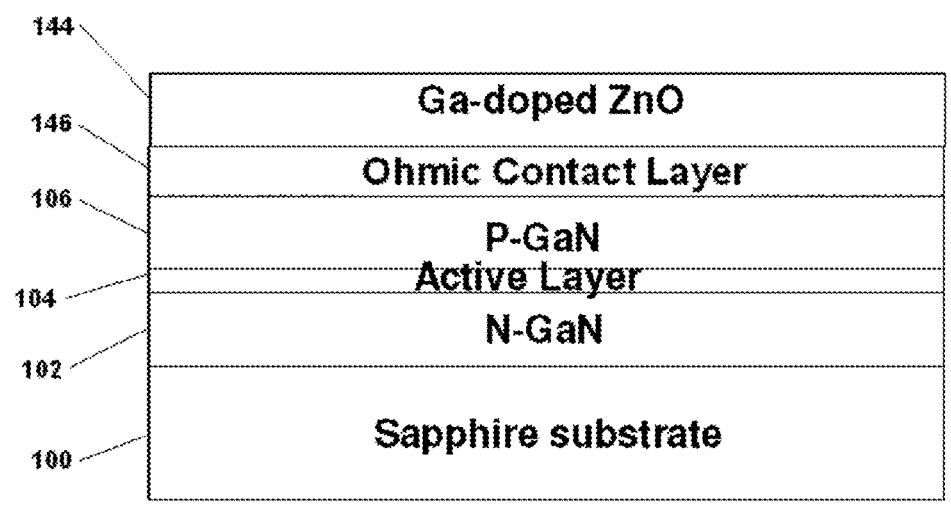
FIG. 16 illustrates an LED including an ohmic contact layer with a composition other than ZnO and produced by the SILAR method and a ZnO layer, according to an exemplary embodiment of the present invention.

FIG. 16 illustrates an LED, according to an exemplary embodiment of the present invention. The LED includes a sapphire substrate 100, an N-doped Gallium Nitride (N-GaN) layer 102, an active layer 104, and a P-doped Gallium Nitride (P-GaN) layer 106. However, any suitable semiconductor layers may be used, and/or the arrangement of the layers may be altered.

In addition, the LED includes an Ohmic contact layer 146 disposed on the P-GaN layer 106, and a ZnO layer 144 disposed on the Ohmic contact layer 146. The Ohmic contact layer 146 may include a ZnO layer of a composition designed to impart low resistance Ohmic contact to the P-GaN, or otherwise terminated top surface of the III-Nitride LED. The Ohmic contact layer 146 may include a doped ZnO formed by a SILAR method, for example. The Ohmic contact layer may also include a layer composed of a material other than ZnO designed to impart low resistance Ohmic contact to the P-GaN, or otherwise terminated top surface of the III-Nitride LED. This layer may include a NiO or Ni(OH)2 layer formed by a SILAR method, for example. The ohmic contact layer 146 operates to provide low resistance Ohmic contact between the P-GaN layer 106 and the ZnO layer 142.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A method of forming an epitaxial ZnO layer using a Successive Ionic Layer Adsorption and Reaction (SILAR) process, the method comprising:
    performing the SILAR process on a substrate comprising GaN, the SILAR process comprising:
        applying a first solution to a substrate to form an inner ionic layer disposed on the substrate and outer ionic layer disposed on the inner ionic layer, the inner ionic layer comprising Zn ions or complexes;
        performing a first washing operation on the substrate to remove the outer ionic layer;
        applying a second solution to the washed substrate to convert the inner ionic layer into an oxide layer;
    repeating the SILAR process; and
    annealing the substrate to form the epitaxial ZnO layer.

2. The method of claim 1, wherein the SILAR process further comprises performing a second washing operation on the substrate after applying the second solution.

3. The method of claim 1, wherein the oxide layer comprises ZnO, ZnOH, or a combination thereof.

4. The method of claim 1, wherein:
the oxide layer comprises ZnO and ZnOH; and
the annealing converts the ZnOH into ZnO.

5. The method of claim 1, wherein the first solution is an aqueous solution comprising Zn ions, Zn complexes, or a combination thereof.

6. The method of claim 5, wherein the first solution further comprises a dopant, an alloying agent, an amine-based complexing ligand, or a combination thereof.

7. The method of claim 1, further comprising cleaning the substrate prior to performing the SILAR process for the first time.

8. The method of claim 1, wherein the SILAR process is repeated for 1 to 30 cycles.

9. The method of claim 1, wherein the annealing comprises:
increasing the temperature of the substrate from room temperature to about 500° C., at a rate of about 25° C. per minute;
maintaining the substrate at 500° C. for about 15 minutes; and
cooling the substrate.

10. The method of claim 1, further comprising:
increasing the thickness of the epitaxial ZnO layer, using a low-temperature aqueous deposition method; and
annealing the substrate comprising the thicker ZnO layer.

11. A method of forming a III-Nitride based LED, the method comprising:
forming a first GaN layer on a substrate, an active layer on the first GaN layer, and a second GaN layer on the active layer, the first and second GaN layers having different ones of a P-type dopant and an N-type dopant;
mesa etching the substrate to expose the first GaN layer;
forming a passivation layer on the mesa-etched substrate;
forming a first photoresist layer on the passivation layer;
etching the substrate using the first photoresist layer as a mask, to expose the second GaN layer;
forming a ZnO layer on the exposed second GaN layer using a Successive Ionic Layer Adsorption and Reaction (SILAR) process;
increasing the thickness of the ZnO layer using a low-temperature aqueous deposition process; and
annealing the substrate.

12. The method of claim 11, further comprising:
forming a second photoresist layer on the substrate after the annealing;
etching the substrate using the second photoresist layer as a mask, to expose portions of the first GaN layer and the ZnO layer;
forming a metal layer on the second photoresist layer and the exposed portions of the ZnO layer and the first GaN layer;
removing the second photoresist layer and portions of the metal layer disposed thereon, to form electrode pads on the ZnO layer and the first GaN layer.

13. The method of claim 12, further comprising:
forming a third photoresist layer on the substrate, so as to cover the electrode pads; and
etching the ZnO layer using the third photoresist layer as a mask.

14. The method of claim 11, further comprising:
forming a third photoresist layer on the substrate after the annealing; and
etching the ZnO layer using the third photoresist layer as a mask.

15. A method of forming a III-Nitride based LED, the method comprising:
forming a first GaN layer on a substrate, an active layer on the first GaN layer, and a second GaN layer on the active layer, the first and second GaN layers having different ones of a P-type dopant and an N-type dopant;
forming a ZnO layer on the second GaN layer using a Successive Ionic Layer Adsorption and Reaction (SILAR) process;
forming a first photoresist layer on the ZnO layer,
etching the ZnO layer using the first photoresist layer as a mask;
mesa etching the substrate to expose the first GaN layer; and
forming electrode pads on the ZnO layer and the first GaN layer.

16. The method of claim 15, wherein the forming of the ZnO layer further comprises increasing the thickness of the ZnO layer using a low-temperature aqueous deposition process.

17. The method of claim 15, wherein the forming of the electrode pads comprises:
forming a second photoresist layer on the substrate and that exposes portions of the ZnO layer and the first GaN layer;
forming a metal layer on the second photoresist layer and the exposed portions of the ZnO layer and the first GaN layer;
removing the second photoresist layer and the portion of the metal layer disposed on the second photoresist layer.

18. A method of forming a III-Nitride based LED, the method comprising:
forming a first GaN layer on a substrate, an active layer on the first GaN layer, and a second GaN layer on the active layer, the first and second GaN layers having different ones of a P-type dopant and an N-type dopant;
forming a ZnO layer on the second GaN layer using a Successive Ionic Layer Adsorption and Reaction (SILAR) process;
forming a passivation layer on the substrate and that exposes a portion of the ZnO layer;
increasing the thickness of the exposed portion of the ZnO layer using a low-temperature aqueous ZnO deposition method;
forming a first photoresist layer on the substrate and that exposes a portion of the passivation layer;
etching the substrate using the first photoresist layer as a mask, to remove the exposed portion of the passivation layer;
mesa etching the substrate to expose a portion of the first GaN layer;
forming a second photoresist layer on the substrate that exposes portions of the ZnO layer and the first GaN layer; and
forming electrode pads on the ZnO layer and the first GaN layer.

19. A method of forming a III-Nitride based LED, the method comprising:
forming a first GaN layer on a substrate, an active layer on the first GaN layer, and a second GaN layer on the active layer, the first and second GaN layers having different ones of a P-type dopant and an N-type dopant;
forming a ZnO layer on the second GaN layer using a Successive Ionic Layer Adsorption and Reaction (SILAR) process;
forming a first photoresist layer on the ZnO layer and that exposes a portion of the ZnO layer;

increasing the thickness of the exposed portion of the ZnO layer using a low-temperature aqueous ZnO deposition method;

forming a second photoresist layer on the substrate and that covers the thicker portion of the ZnO layer;

etching the substrate using the second photoresist layer as a mask, to expose a portion of the first GaN layer; and forming electrode pads on the ZnO layer and the exposed portion of the first GaN layer.

20. The method of claim 19, wherein the forming of the electrode pads comprises:

forming a third photoresist layer on the substrate and that exposes portions of the ZnO layer and the first GaN layer;

forming a metal layer on the third photoresist layer and the exposed portions of the ZnO layer and the first GaN layer; and removing the third photoresist layer and the portion of the metal layer disposed on the second photoresist layer.

21. A method of forming a III-Nitride based LED, the method comprising:

forming a first GaN layer on a substrate, an active layer on the first GaN layer, and a second GaN layer on the active layer, the first and second GaN layers having different ones of a P-type dopant and an N-type dopant;

forming a first photoresist layer on the second GaN layer;

mesa etching the substrate, using the first photoresist layer as a mask, to expose the first GaN layer;

forming a second photoresist layer on the substrate and that exposes the second GaN layer;

forming a ZnO layer on the second GaN layer using a Successive Ionic Layer Adsorption and Reaction (SILAR) process that uses second photoresist layer as a mask;

forming an electrode pad on the first GaN layer;

forming a third photoresist layer on the substrate and that exposes the ZnO layer;

increasing the thickness of the ZnO layer using a low-temperature aqueous ZnO deposition method; and forming an electrode pad on the ZnO layer.

22. A method of forming a III-Nitride based LED, the method comprising:

forming a first GaN layer on a substrate, an active layer on the first GaN layer, and a second GaN layer on the active layer, the first and second GaN layers having different ones of a P-type dopant and an N-type dopant;

forming a passivation layer on the substrate and that exposes a portion of the second GaN layer;

forming a ZnO layer on the exposed portion of the second GaN layer using a Successive Ionic Layer Adsorption and Reaction (SILAR) process;

etching the passivation layer to expose a portion of the second GaN layer;

mesa etching the substrate to expose portions of the first GaN layer;

forming a first photoresist layer on the substrate and that exposes portions of the first GaN layer and the ZnO layer; and forming electrodes on the exposed portions of the first GaN layer and the ZnO layer.

23. The method of claim 22, wherein the forming of the ZnO layer further comprises using a low-temperature aqueous ZnO deposition process to increase the thickness of the ZnO layer.

24. A III-Nitride LED comprising:

a substrate;

a first GaN layer disposed on the substrate;

an active layer disposed on the first GaN layer;

a second GaN layer disposed on the active layer; and a ZnO composite layer disposed on the second GaN layer, the composite layer comprising:

a first ZnO layer disposed on the second GaN layer and having a first conductivity; and a second ZnO layer disposed on the first ZnO layer and have a second conductivity that is higher than the first conductivity.

25. The III-Nitride LED of claim 24, wherein the composite layer comprises a plurality of the first ZnO layers and a plurality of the second ZnO layers, the first and second ZnO layers being alternately stacked on the second GaN layer.

26. The III-Nitride LED of claim 24, wherein:

the first ZnO layer comprises a dopant, or a metal oxide, that increases the band gap of the first ZnO layer; and the second ZnO layer comprises an N-type dopant.

27. The III-Nitride LED of claim 24, wherein:

the first ZnO layer is doped with Mg or comprises an MgO/ZnO alloy; and the second ZnO layer is doped with an N-type dopant.

* * * * *